(12) United States Patent
Davis (10) Patent No.: US 7,109,130 B2
(45) Date of Patent: Sep. 19, 2006

(54) ZEOLITE FILMS FOR LOW K APPLICATIONS

(75) Inventor: Mark E. Davis, Pasadena, CA (US)

(73) Assignee: California Institute of Technology, Pasadena, CA (US)

(*) Notice: Subject to any disclaimer, the term of this patent is extended or adjusted under 35 U.S.C. 154(b) by 0 days.

(21) Appl. No.: 11/123,504

(22) Filed: May 4, 2005

(65) Prior Publication Data

US 2005/0282401 A1    Dec. 22, 2005

Related U.S. Application Data

(60) Provisional application No. 60/567,912, filed on May 4, 2004.

(51) Int. Cl.
| | |
|---|---|
| H01L 21/26 | (2006.01) |
| H01L 21/42 | (2006.01) |
| H01L 21/324 | (2006.01) |
| H01L 21/477 | (2006.01) |

(52) U.S. Cl. ........................ 438/778; 438/967

(58) Field of Classification Search ................ 438/622, 438/628, 778, 435, 967
See application file for complete search history.

(56) References Cited

U.S. PATENT DOCUMENTS

| | | | | |
|---|---|---|---|---|
| 6,329,062 | B1 * | 12/2001 | Gaynor ...................... 428/447 |
| 6,566,243 | B1 * | 5/2003 | Gaynor ...................... 438/622 |
| 6,573,131 | B1 * | 6/2003 | Yan et al. .................. 438/207 |
| 6,630,696 | B1 * | 10/2003 | Yan et al. .................. 257/200 |
| 2004/0042792 | A1 * | 3/2004 | Samara-Rubio et al. ...... 398/45 |
| 2004/0091419 | A1 * | 5/2004 | Ogihara et al. ............. 423/702 |
| 2004/0102031 | A1 * | 5/2004 | Kloster et al. .............. 438/619 |
| 2005/0087873 | A1 * | 4/2005 | Wu et al. ................... 257/751 |
| 2005/0181593 | A1 * | 8/2005 | Leu et al. ................... 438/619 |
| 2005/0244995 | A1 * | 11/2005 | Fukuchi et al. .............. 438/30 |

OTHER PUBLICATIONS

Corma, et al., "Supramolecular self-assembled molecules as organic directing agent for synthesis of zeolites," Nature (2004) 431:287-290. (Also includes supplementary material published on Nature's web page.).

Li, et al., "Effects of crystallinity in spin-on pure-silica-zeolite MFI low-dielectric-constant films," Adv. Funct. Mater. (2004) 74:1019-1024.

Mitra, et al., "Synthesis and evaluation if pure-silica-zeolite BEA as low dielectric constant material for microprocessors," Ind. Eng. Chem. Res. (2004) 43:2946-2949.

(Continued)

*Primary Examiner*—S. V. Clark
(74) *Attorney, Agent, or Firm*—Mintz, Levin, Cohn, Ferris, Glovsky and Popeo, P.C.

(57) ABSTRACT

A method is provided for making an integrated circuit dielectric. A structure-directing agent (SDA) is provided. Preferably this structure-directing agent is a salt of a polycyclic organic compound. By use of the structure-directing agent, a film of a zeolite having a framework density below 15 T atoms per 1000 cubic angstroms and comprising primarily silicon and/or germanium atoms in the T positions is provided on a semiconductor substrate. Preferably the zeolite has the LTA structure. The structure-directing agent is removed from the film. The removal may be effected, for example, by heating or by chemically and/or photochemically decomposing the structure-directing agent, preferably in a manner which allows it to be recovered. The film is then optionally modified to reduce its hydrophilicity.

22 Claims, 4 Drawing Sheets

OTHER PUBLICATIONS

Wang, et al., "Pure silica zeolite films as low-k dielectrics by spin-on nanoparticle suspensions," Adv. Mater. (2001) 13:1463-1466.

Wang, et al., "Pure-silica zeolite low-k dielectric thin films," Adv. Mater. (2001) 13:746-749..

Yan, et al., "Zeolite ZSM-5 membranes grown on porous $\alpha$-$Al_2O_3$," J. Chem. Soc. Chem. Commun. (1995) 227-228.

Yan, et al., "Preparation of zeolite ZSM-5 membranes by in-situ crystallization on porous $\alpha$-$Al_2O_3$," Ind. Eng. Chem. Res. (1995) 34:1652-1661.

* cited by examiner

ZEOLITE FILMS FOR LOW K APPLICATIONS

CROSS-REFERENCE TO RELATED APPLICATIONS

This application claims priority under 35 U.S.C. § 119(e)(1) to Provisional U.S. Patent Application Ser. No. 60/567,912, filed May 4, 2004. The disclosure of this provisional application is incorporated by reference in its entirety.

TECHNICAL FIELD

This invention relates generally to high silica containing zeolites, and in particular to the use of high silica containing zeolites with low framework densities as low dielectric constant films in semiconductor device manufacturing.

BACKGROUND

For many years nonporous silicon dioxide (also referred to as silica) has been used as the primary dielectric to separate the wires which interconnect transistors and other devices in integrated circuits. There has been a desire in recent years to replace silica with a material having a lower dielectric constant k. A primary reason for this desire is the fact that a lower dielectric constant would, at constant geometry, reduce the capacitance between the wires and ground and between different wires. A reduction in these capacitances would result in faster charging and discharging of these wires, i.e., faster signal propagation, as well as diminished cross-talk between the signals carried on different wires.

The search for a lower k dielectric has examined a wide variety of materials. A promising approach to lowering k is to introduce porosity into silica. Because the dielectric constant of air is slightly above 1, air-filled pores will tend to lower the dielectric constant of silica. Three types of porous silica have been studied: sol-gel silica, surfactant-templated mesoporous silica, and pure silica zeolites (PSZ). Sol-gel silica has been shown to have exceptionally high porosity and thus extremely low k (e.g., k=1.2) in studies in which supercritical drying was used to generate an aerogel. However, sol-gel silica with high porosity has also been found to have low mechanical strength and low thermal conductivity. The shrinkage which sol-gel silica undergoes during drying is also a concern for dielectric applications. Another drawback of sol-gel silica is that it has a wide pore size distribution. The large pores at the upper end of this wide size distribution could result in dielectric breakdown. Furthermore, sol-gel silica is hydrophilic and tends to adsorb water. Because the dielectric constant of water is about 80–90, even minor adsorption of water could increase k significantly.

Surfactant-templated mesoporous silica has also been evaluated as a potential low-k material. It has been shown that templated mesoporous silica can achieve high porosity, and thus a low k. Such silica has also been shown to have more uniform pores than sol-gel silica, obviating concerns relating to unusually large pores. However, because it is amorphous, it could face some of the same problems as sol-gel silica with respect to mechanical strength and hydrophilicity.

A further approach to a low k dielectric material is the use of pure silica zeolites. In general a zeolite is a crystal comprising a framework of tetrahedrally-bonded atoms linked by oxygens. The tetrahedrally-bonded atoms are commonly aluminum and/or silicon, and also can be, for example, phosphorus or germanium. Zeolites tend to be microporous, i.e., to have pores of size<2 nm. Some zeolites are naturally occurring minerals, of which the earliest was discovered in the eighteenth century. In recent decades there has been a great deal of progress in the synthesis of zeolites. For a discussion of zeolites in general, please refer to the *Handbook of Zeolite Science and Technology* (Scott M. Auerbach et al. eds., 2003).

An important characteristic of any zeolite is its framework structure, that is to say, the spatial arrangement of the tetrahedrally-bonded (T) atoms, the oxygen atoms, and the bonds between T atoms and oxygen atoms. Zeolite framework structures are designated by three letter codes (e.g., CON, LTA, MFI) assigned by the International Zeolite Organization. Obviously, multiple different zeolites of different T atom compositions can have the same zeolite framework structure.

In understanding zeolite framework structures, it is useful to think of them in a simplified representation in which all T-O-T pairs of bonds are visualized as being straight (although in reality the angle at which the two T-O bonds meet at the oxygen can vary widely within a zeolite and between different zeolites). With the simplified representation, one can view the zeolite framework structure as being a collection of T atoms arranged in a particular way in space, interconnected by straight lines which represent the T-O-T bonds. Images of simplified representations of zeolite framework structures are available, together with much other information, at http://topaz.ethz.ch/IZA-SC/StdAtlas.htm.

Unlike sol-gel silica and mesoporous silica, pure silica zeolites would be expected to have high mechanical strength and heat conductivity due to their regular crystalline structure. They also have small pores (<1 nm) with a very narrow pore size distribution. Thus the electric breakdown problem is minimized. Although the aluminosilicate zeolites are hydrophilic, pure silica zeolites are hydrophobic, which should help reduce water adsorption. Based on these considerations, Yushan Yan at the University of California at Riverside has been working on PSZ low-k films for the last five years. The first effort was focused on films of zeolites having the MFI structure. MFI was chosen because there were many known synthesis recipes available for MFI. In addition, MFI has a reasonable level of porosity, and pure-silica MFI structured zeolites are very hydrophobic. A film was produced by in situ crystallization with good mechanical characteristics, good hydrophobicity, but with k=2.7. In later studies, Yan and colleagues have reported producing a film using zeolites of the *BEA structure, achieving k=2.3.

There is therefore a need for a low-k dielectric for integrated circuit applications based on high silica containing zeolites which have a higher porosity than MFI or *BEA.

SUMMARY OF THE INVENTION

In an embodiment of the invention, a method is provided for making an integrated circuit dielectric. A structure-directing agent (SDA) is provided. By use of the structure-directing agent, a film of a high silica containing zeolite having a framework density below 15 T atoms per 1000 cubic angstroms is provided on a semiconductor substrate. The structure-directing agent is removed from the film. The film is then optionally modified the film to reduce its hydrophilicity.

In a further embodiment of the invention, a method is provided for making integrated circuits. Electronic devices are formed on a semiconductor substrate. A dielectric comprising a zeolite having a framework density below 15 T atoms per 1000 cubic angstroms is deposited upon the substrate. Interconnect layers are deposited upon the substrate. The deposition of dielectric and interconnect layers may be interleaved. The substrate with deposited dielectric and interconnect is diced, packaged, and optionally tested.

DETAILED DESCRIPTION OF EMBODIMENTS OF THE INVENTION

Before describing the present invention in detail, it is to be understood that this invention is not limited to specific solvents, materials, or device structures, as such may vary. It is also to be understood that the terminology used herein is for the purpose of describing particular embodiments only, and is not intended to be limiting.

It must be noted that, as used in this specification and the appended claims, the singular forms "a," "an," and "the" include both singular and plural referents unless the context clearly dictates otherwise. Thus, for example, reference to "a nanocrystal" includes a plurality of nanocrystals as well as a single nanocrystal, reference to "a temperature" includes a plurality of temperatures as well as single temperature, and the like.

The term "semiconductor substrate" refers to any substrate considered suitable for the manufacture of semiconductor devices and integrated circuits. The term also refers to the substrate during or after any of the various stages of treatment through which it goes during the process of semiconductor device and/or integrated circuit manufacture, for example during or after the deposition of dielectric or of interconnect conductors.

"Optional" or "optionally" means that the subsequently described circumstance may or may not occur, so that the description includes instances where the circumstance occurs and instances where it does not.

An important figure of merit for evaluating potential zeolites for use in dielectric films is the framework density. This density is defined as the number of T atoms per 1000 cubic angstroms of volume. The term "T atom" here denotes a tetravalent atom. In pure silica zeolites, most or all of the T atoms will be silicon. The framework density is a function of the framework structure. In general, it may be expected that a lower framework density will result in a lower dielectric constant. The readily synthesized zeolites of the MFI structure have the drawback of having a relatively high framework density of 18.4 T atoms per 1000 cubic angstroms. The LTA structure has a relatively low framework density of 12.9 T atoms per 1000 cubic angstroms.

In an embodiment of the invention, a method is provided for making an integrated circuit dielectric. A structure-directing agent (SDA) is provided. By use of the structure-directing agent, a film comprising a zeolite having a framework density below 15 T atoms per 1000 cubic angstroms is provided on a semiconductor substrate. The structure-directing agent is removed from the film. The film is then optionally modified the film to reduce its hydrophilicity.

The zeolite contained in the film formed by the method of the invention is preferably is composed primarily of silicon or germanium atoms in the T positions. Such zeolites may require for their synthesis, as in the method of the invention, that a structure-directing agent be used. Such structure-direction agents are useful, for example, in order to prevent the formation of a competing phase of amorphous silicon dioxide, which would obstruct formation of the zeolite.

The structure-directing agent of the invention is preferably selected to fit with the geometry of the interior spaces of the zeolite desired to be grown with its assistance. Among the factors that go into the choice of a structure-directing agent are the existence of multiple van der Waals contacts with the interior surface of the zeolite to be grown, limited complexing with the solvent to be used in the growth process, and avoidance of formation of competing phases.

In general, the shape specificity of a structure-directing agent may need to be greater for the initial synthesis of a particular zeolite than for subsequent manufacture. That is because it is found that where crystals of a zeolite are used as nuclei in the formation of additional crystals of that zeolite from T atom precursors, in general a wider variety of structure-directing agents may be employed.

Common structure-directing agents are polycyclic organic salts, particularly hydroxy salts. It is found that rings are helpful in conferring stiffness and bulk. Amines are commonly useful as structure-directing agents.

Figure 1:
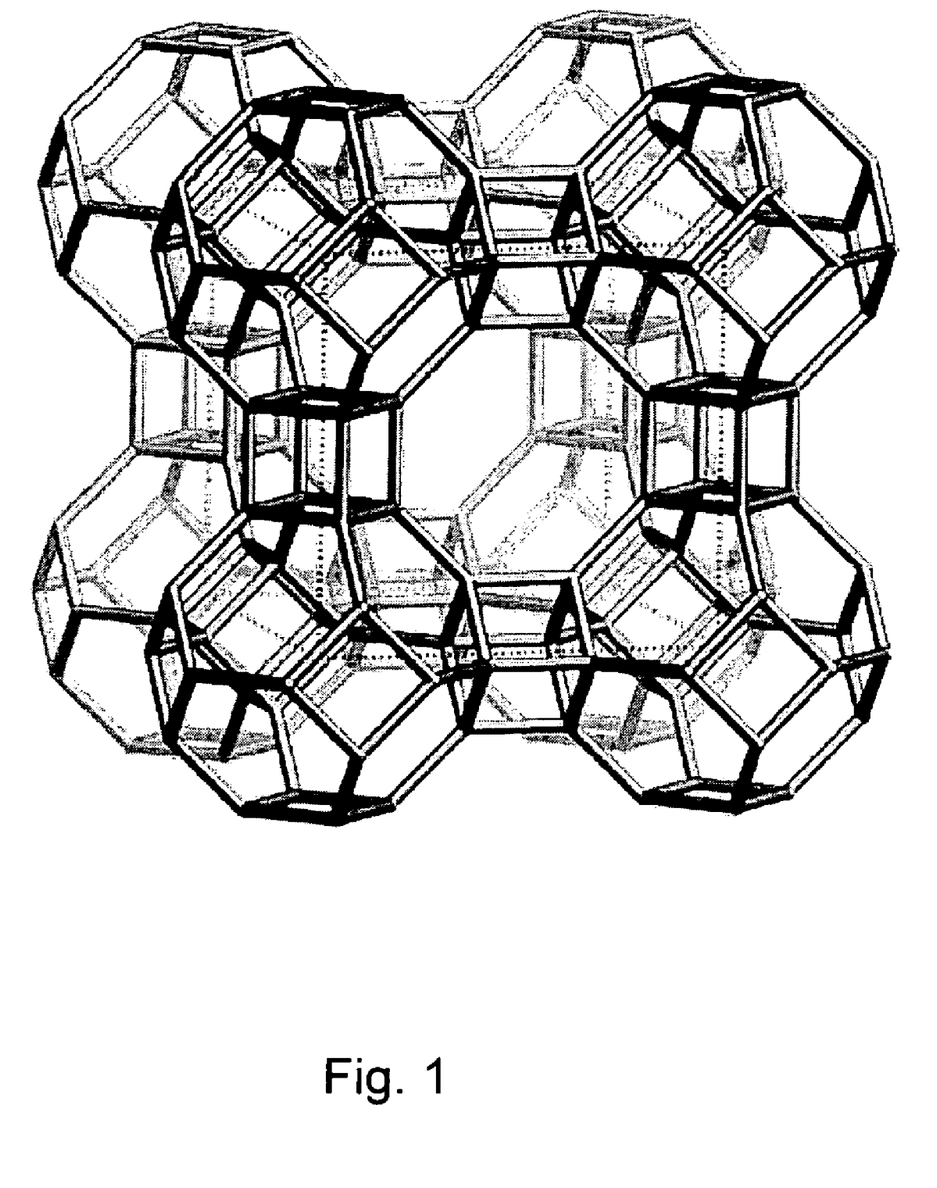
FIG. 1 (prior art) depicts the zeolite framework structure called LTA.

A preferred framework structure for the zeolite contained in the films of the invention is the LTA structure. As indicated above, it is helpful to think of this structure in terms of a simplified representation in which the T-O-T bond pairs are thought of as straight lines. In this simplified representation, a repeating unit for the LTA structure is a sodalite cage (also referred to as a β-cage) plus three cubes. The LTA structure consists of this repeating unit, infinitely repeated in space in all three directions, with the outer faces of the three cubes coinciding with squares on the sodalite cages of the next unit over. FIG. 1 (prior art) depicts the LTA structure in the simplified representation discussed above. The lines of the figure are shaded so as to facilitate the perception of the spatial relationships.

As may be seen from FIG. 1, the sodalite cage is formed of six squares and eight hexagons, joined to form a rough sphere. In that sphere there is a square at each of the pole, and four squares around the equator, with the equator bisecting them diagonally. The remaining space is tiled with the eight hexagons, four above and four below the equator. Each hexagon has a segment along the equator, a segment forming part of a polar square, two segments each forming part of an equatorial square, and two segments each joining a vertex of an equatorial square to a vertex of a polar square. Each square has a cube attached to it. In the simplified representation in which T-O-T bond pairs are thought of as straight lines, the squares and hexagons are each contained in a plane.

As may further be seen from FIG. 1, there are eight sodalite cages in the figure, arranged at each of the vertices of a cube (shown in dashed lines). It may be seen that the primary pore in this structure lies in the center between the eight sodalite cages. For a molecule to access that pore, it must pass through an octagon formed of four vertices from cubes joining sodalite cages and four vertices from hexagons on the surface of sodalite cages. When one takes into account the actual geometry of the T-O-T bonds, the inner dimension of this octagon is about 4.1 angstroms.

A preferred structure-directing agent for the LTA structure is a lower alkyl-substituted polycyclic hydroxide. A particularly preferred agent is 4-methyl-2,3,6,7-tetrahydro-1H,5H-pyrido [3.2.1-ij] quinolinium hydroxide:

The synthesis of this structure-directing agent is described in Example 1 below. It is believed that the two non-aromatic rings of this agent are approximately planar.

As noted above, in certain methods of the invention, a film comprising a zeolite is formed on a semiconductor substrate. As discussed in more detail below, this may be a semiconductor substrate on which devices, interconnect, and dielectric have already been formed or deposited. Thus, the exposed surface of the semiconductor substrate upon which the film is formed may comprise silicon, silicon dioxide, a zeolite-containing dielectric, a different type of dielectric (e.g., mesoporous silica), and/or metal interconnect.

The film comprising the zeolite is preferably of a thickness on the order of hundreds of nanometers. Dielectric film thicknesses are roughly designed to accommodate minimum-sized wires of approximately square cross section, and wires for the lowest levels of interconnect tend to have dimensions on the order of the minimum feature size (currently around 90 nm). Thus, the film comprising the zeolite is preferably less than 200 nm thick. This film may be deposited at a somewhat greater thickness and polished down through various polishing techniques such as the chemical-mechanical polishing employed in the semiconductor industry.

The film comprising the zeolite may be formed by means of in situ crystallization. As general background, please see Y. Yan et al., *Ind. Eng. Chem. Res.,* 1995, 34, 1652–61. In an in situ crystallization process, a surface of the semiconductor substrate is immersed in a solution suitable for growth of the zeolite and subjected to conditions which allow the zeolite to form. These conditions may be based, for example, on those of Example 2 below. In general, conditions for zeolite formation will include availability in proper proportions of the T atom precursors (e.g., alkyl silicates such as TEOS, tetraethyl ortho silicate), the structure-directing agent, and a source of suitable ions such as $F^-$ ions, as well as heating to a suitable temperature generally between 100 and 200° C. Previously formed zeolite crystals may be employed in this process as nuclei to facilitate the crystallization. The films resulting from in situ crystallization will generally be polycrystalline with a certain amount of mesoporosity in the space between the crystals. In general this mesoporosity is preferably of a size smaller than the minimum feature size of the integrated circuit. Control of temperature, solvent composition, and other conditions will allow the control of this mesoporosity, as discussed in the Yan et al. reference cited above.

The film comprising the zeolite may also be formed by spinning on a suspension of previously formed zeolite crystals onto the semiconductor substrate. As discussed above it is preferable for the films to be on the order of hundreds of nanometers in thickness. Thus, the spun-on zeolite crystals are also preferably of that size or a lower size. This may be achieved as a consequence of the conditions under which the synthesis of the crystals takes place or by means of subsequent size selection of the crystals, as for example using centrifugation. The film is subjected generally to a bake after spin-on to remove solvent. It should be noted that the film so formed will often have both the microporosity of the individual crystals (for example the microporosity of the LTA framework structure discussed above) and mesoporosity arising from the imperfect alignment of the individual crystals as the film forms.

As noted above, in certain processes of the invention the structure-directing agent is removed. The removal of the structure-directing agent may be performed simply by calcination at an appropriate temperature. However, the temperature required for calcination may be high for certain structure-directing agents. This is seen, for example, in Example 2 below where a temperature of 650° C. was needed for a preferred agent in Si—Ge zeolite crystals and seemingly insufficient for complete elimination of SDA in the related pure Si crystals. In semiconductor processing higher temperatures may be undesirable, for example because they could result in thermally-induced mechanical stresses or undue dopant diffusion. Thus, in the choice of a structure-directing agent, one desirable characteristic is a lower temperature for calcinations.

An alternative way to effect the removal of the structure-directing agent is to employ chemical means. The structure-directing agent is so chosen that, at a suitably low temperature, an appropriate reagent causes its decomposition. This is particularly desirable in case the structure directing agent is an expensive substance which could be recovered from its decomposition products. An example of a suitable decomposition pathway is the effect of acidity on ketals, as has been demonstrated by Hyunjoo Lee et al., *Nature,* 2003, 425, 385–88. For example, the equilibrium in can be shifted to the right by increasing acidity. Thus, a basic structure directing-agent containing a cycloketal as indicated above can be partially decomposed by subjecting it to acidic conditions. This partial decomposition may reduce the agent in size sufficiently that the $R_1R_2C=O$ moiety is readily recovered from the zeolite for reuse in the formation of further zeolite crystals. Alternatively, the decomposition could be done using photochemical methods. That is to say, the structure directing agent can contain a chemical moiety that when exposed to certain wavelengths of light undergoes a chemical reaction. More specifically, the preferred wavelengths are in the UV range that are commonly used in standard photolithographic methods in the semiconductor device manufacturing industry. The structure directing agent undergoes a chemical transformation when exposed to light to enable its removal from the zeolite structure by extraction. Fro example, this transformation can be an isomerization to create an isomer of smaller size or a true chemical bond cleavage reaction yielding molecular fragments that can be removed (photochemical analogue of the chemical process illustrated with ketals above).

As noted above, in certain methods of the invention it may be desirable to optionally treat a zeolite film further once it is formed in order to reduce its hydrophilicity. In general, zeolite films made with Si and Ge will be hydrophobic. However, there may still be residual hydrophilicity, for example as a consequence of remaining OH functionality on the surface of the crystals. When films are polycrystalline and contain many small crystals, there is the potential for increased numbers of surface hydroxyl groups that terminate the crystals and serve as sites for the adsorption of water. Such hydrophilicity may be reduced, for example, by means of vapor phase silylation of these hydroxyl groups with a suitable reactant such as chlorotrimethylsilane that renders the surface hydrophobic by converting the surface termination into methyl groups.

In a further embodiment of the invention, a method is provided for making integrated circuits. Electronic devices are formed on a semiconductor substrate. A dielectric comprising a zeolite having a framework density below 15 T atoms per 1000 cubic angstroms is deposited upon the substrate. Interconnect layers are deposited upon the substrate. The deposition of dielectic and interconnect layers may be interleaved. The substrate with deposited dielectric and interconnect is diced, packaged, and optionally tested.

In more detail, on a semiconductor substrate (for example a 300 mm silicon wafer) electronic devices, for example MOS transistors, bipolar transistors, resistors, and capacitors, are formed by means of processes including steps such as ion implantation of dopants and growth of gate oxide. When devices are so formed, it is necessary to interconnect them in order to form a suitable pattern of conductive wires, separated by dielectric, which result in the semiconductor substrate implementing a designed digital or analog or mixed digital/analog electronic circuit. In the process of forming this pattern of wires separated by dielectric, one or more dielectric films comprising zeolites with low framework density may be deposited in the manner indicated previously. Other types of dielectric films may also be used in the same integrated circuit. The dielectrics may be coated with photoresist, exposed, and patterned. Room for lines, vias, and contacts may be etched using the patterned photoresist and a suitable etching system as for example a plasma or reactive ion type of etching. Interconnect metal may be laid down in the room that has been opened for lines, vias, and contacts. The interconnect metal may take the form, for example, of a liner and/or barrier layer followed by a seed layer and a copper layer. The deposition of interconnect metal may employ suitable techniques such as electroplating, electrochemical deposition, chemical vapor deposition, or physical vapor deposition (PVD). After the deposition of metal, the "hilly" metal and dielectric surface which results may be subjected to a flattening or polishing process. Commonly a number of layers of dielectric and metal will be deposited one on top of the other. Following deposition of these layers, the semiconductor substrate with the layers may be passivated and diced into individual integrated circuits, which are packaged and optionally tested before or after packaging. The process of packaging may, for example, include mechanically attaching the integrated circuit to a ceramic or other package, and connecting electrically pads formed on the integrated circuit to the pins or balls of the package. Other variants on these processes of semiconductor fabrication are known to those of skill in the art.

It is to be understood that while the invention has been described in conjunction with the preferred specific embodiments thereof, the foregoing description and the examples that follow are intended to illustrate and not limit the scope of the invention. Other aspects, advantages, and modifications within the scope of the invention will be apparent to those skilled in the art to which the invention pertains.

All patents, patent applications, and publications mentioned herein are hereby incorporated by reference in their entireties. However, where a patent, patent application, or publication containing express definitions is incorporated by reference, those express definitions should be understood to apply to the incorporated patent, patent application, or publication in which they are found, and not to the remainder of the text of this application, in particular the claims of this application.

EXAMPLE 1

Synthesis of SDA
(4-methyl-2,3,6,7-tetrahydro-1H,5H-pyridio
[3.2.1-ij] Quinolinium Hydroxide)

Amine Quarternization Procedure. 12.017 g julolidine (Acros) were dissolved in 100 mL chloroform (EMD Chemicals), giving a dark orange/red solution. 11.5 mL filtered methyl iodide (Aldrich) were added to the solution. The air was purged from the flask using an argon line. The flask was placed under an argon atmosphere and wrapped with aluminum foil. The solution was stirred for 3 days at room temperature on stir setting 6. 11.5 mL filtered methyl iodide were added to the flask, and the solution was then stirred for 3 days on stir setting 6. 11.5 mL filtered methyl iodide were added again to the flask, and the solution was again stirred for 3 days on stir setting 6. The solution was quenched with 50 mL methanol, then stirred for 30 minutes. The solution was evaporated using a rotary evaporator. The solids obtained from evaporation were washed exhaustively with ether. The solids were then vacuum dried for 1 hour giving a red powder, and stored in the refrigerator.

Recrystallization of Methylated Julolidine. The powder previously obtained was dissolved in 100 mL dichloromethane (EMD) at the boiling point of the solvent. 50 mL of hexane (EMD) was added down the sides of the flask to form a layer on top of the dichloromethane. The flask was covered with parafilm and placed in freezer overnight. The solution was filtered in the flask. The crystals were washed with 100 mL of hexane that had been stored in the freezer for an hour previously. The preceding steps were repeated on the crystals so obtained. Following this repetition, the resulting crystals, which were light yellow/cream, were vacuum dried.

Ion Exchange of Methylated Julolidine. The result of the preceding recrystallization was dissolved in 375 mL deionized water. 35 g Bio-Rad AGI-X8 (Bio-Rad) ion exchange resin were added to the solution and stirred for 24 hours. The solution was filtered to remove the resin The solution was titrated with 0.01M hydrochloric acid (J. T. Baker) to determine the extent of ion exchange. The preceding ion exchange steps were repeated twice until conversion was 90%. Most of the water was then evaporated from the solution using the rotary evaporator. The final solution was then stored in the refrigerator, covered with aluminum foil. Color: light yellow.

Figure 2:
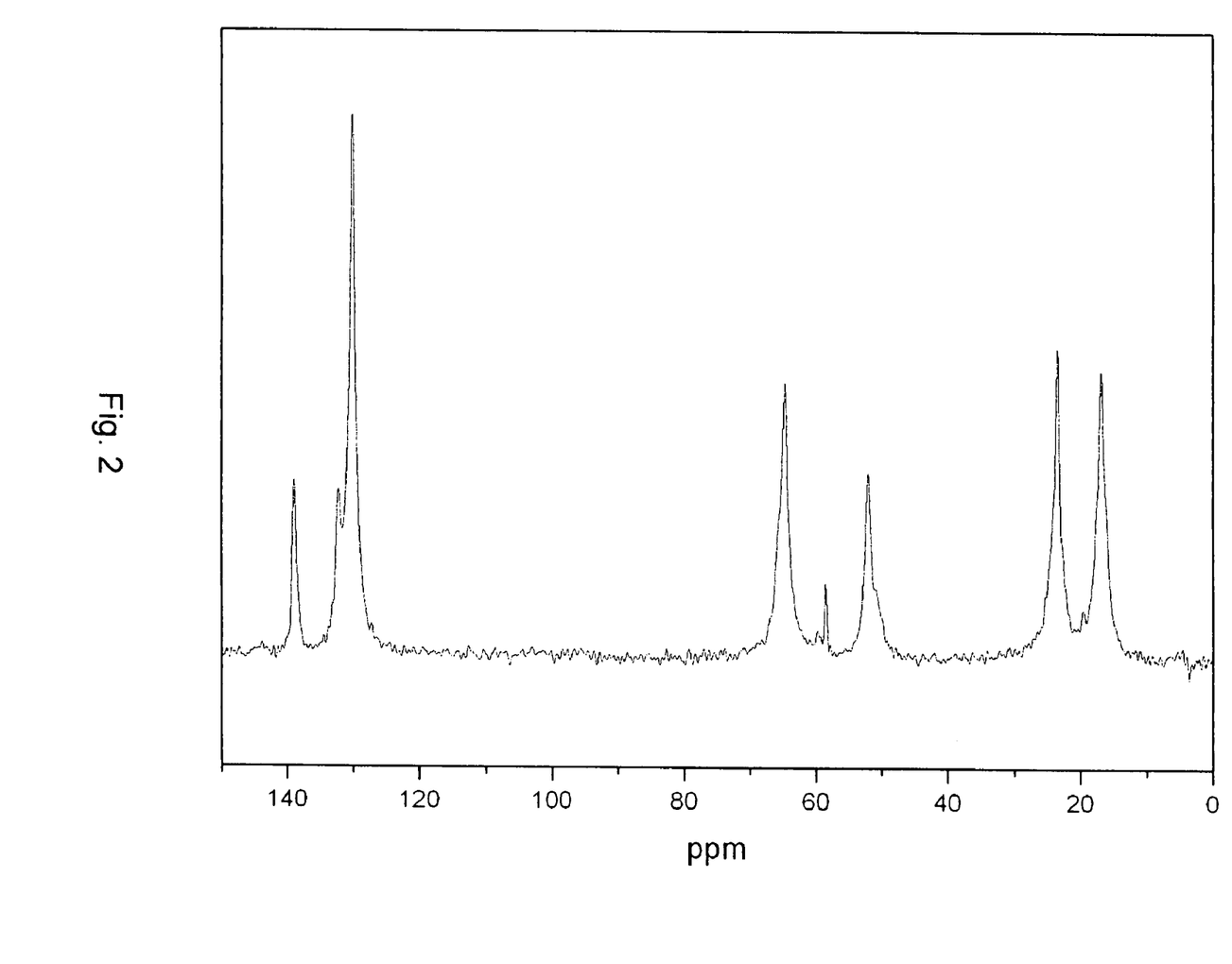
FIG. 2 depicts the $^{13}$C CP/MAS (cross-polarization/magic angle spinning) NMR spectrum of a preferred structure-directing agent for the manufacture of the dielectric films of the invention.
Figure 3:
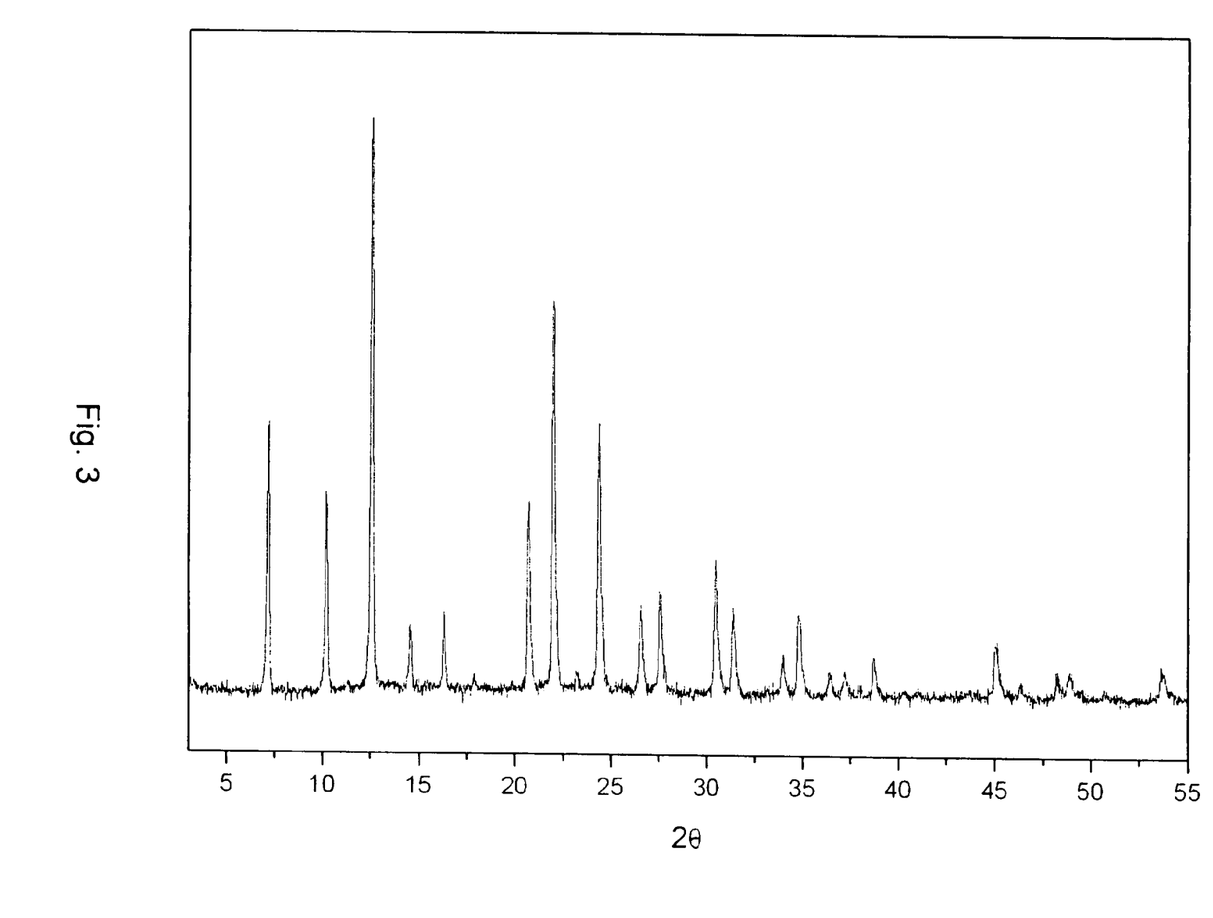
FIG. 3 depicts an X-ray diffraction pattern for a zeolite usable in the dielectric films of the invention.

The $^{13}$C CP/MAS (cross-polarization/magic angle spinning) NMR spectrum (300 MHz, D$_2$O) of the SDA was measured as follows: 18.2, 25.8, 53.5, 65.9, 131.2, 132.0, 132.5, 141.0 ppm. The spectrum is depicted in FIG. 2.

EXAMPLE 2

Synthesis of Si—Ge-LTA Using SDA of Example 1

Figure 4:
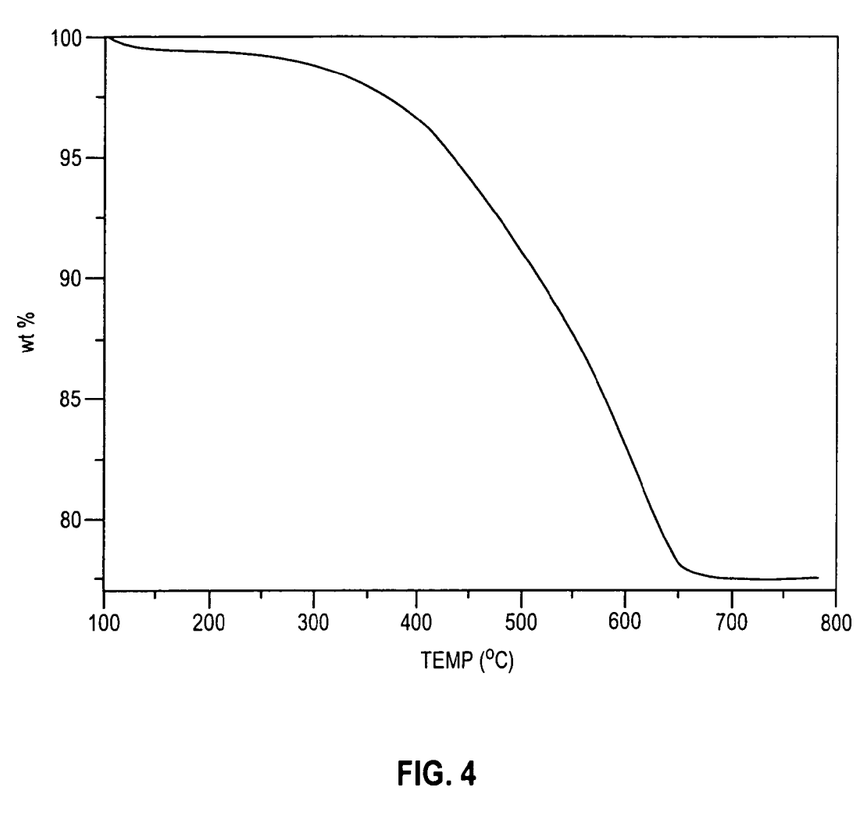
FIG. 4 depicts the weight as a function of temperature for a zeolite usable in the dielectric films of the invention, showing that temperatures of about 650° C. are needed to eliminate the structure-directing agent in this particular process.

To 3.07 g of SDA solution (3.61 g SDA/15.08 g solution), 1.00 g of TEOS (98%, Aldrich) and 0.25 g of GeO$_2$ (99.99+%, Aldrich) were added. The mixture was kept under stirring until the ethanol formed upon hydrolysis of TEOS for about 6 hrs. The ethanol and water were evaporated to reach the gel composition by vacuuming. 0.15 g of HF (48%, Aldrich) was added to the gel. The mixture was introduced in a Teflon-lined reactor and heated statically at 150° C. for 5 days. The resulting composition was determined to be 0.67 SiO$_2$:0.33 GeO$_2$:0.5SDA :0.5HF:7H$_2$O. The composition was subsequently heated, producing the weight versus temperature curve of FIG. 4. The fact that the weight only stops declining around 650° C. indicates that a rather high calcination temperature is required to remove the SDA. In other experiments, a pure-silica version of the zeolite of this example was made (Example 3). At 650° C. it appeared that significant char from the SDA was still present in the pure-silica zeolite.

EXAMPLE 3

Synthesis of Pure Silica LTA Using the SDA From Example 1

The following table indicates the chemicals required for this synthesis.

| Chemicals | TEOS | TMAOH | SDA | HF | H$_2$O | |
|---|---|---|---|---|---|---|
| Vendor | Aldrich | Aldrich | Example 1 | Aldrich | Still | |
| MW | 208.33 | 91.15 | 205.30 | 20.01 | 18.02 | Jar Total |
| Purity | 100% | 25% | 100% | 48% | 100% | Mass |
| Molar ratio | 1.00 | 0.25 | 0.25 | 0.50 | 2.00 | (w/o HF) |
| Desired Mass (g) | 2.000 | 0.875 | 2.259 | 0.200 | −2.097 | 1.960 |
| Actual Mass (g) | 2.006 | 0.873 | 2.226 | 0.210 | | 1.958 |

| | OH$^-$ | I$^-$ | H$_2$O | Solution Total |
|---|---|---|---|---|
| Initial SDA (aq) composition (g) | 10.98 | 1.859 | 37.491 | 50.33 |

The gel was prepared in a teflon jar with parafilm over the top by hydrolyzing tetraethylorthosilicate (TEOS) in an aqueous solution of the structure directing agent (ROH) and tetramethylammonium hydroxide (TMAOH). The mixture was stirred for 24 hours at room temperature until ethanol formed upon the hydrolysis of TEOS. The ethanol formed upon hydrolysis and excess water were evaporated after removing the parafilm and screwing onto the jar a teflon screw-on cap with two small holes in it, using a vacuum desiccator until completely dry. As necessary, water was added to the jar to obtain the correct total mass, and the sample was stirred with a teflon spatula. An aqueous solution of hydrofluoric acid was added to the jar, and the sample was stirred with a teflon spatula. The mixture was introduced in a teflon-lined reactor and heated at 135° C. for 7 days, 18 hours. The reactor was removed from the oven and cooled. The final mixture was filtered to obtain crystalline material, which was washed with 100 mL each of acetone and water. The crystalline material was placed in an evaporating dish and dried for 24 hours. We have also obtained LTA from a sample with a gel composition of 1.00:0.25:0.35:0.60:2.00 of TEOS:TMAOH:SDA:HF:H$_2$O heated for 7 days in the reactor (increased SDA amount).

I claim:

1. A method of making an integrated circuit dielectric, comprising the steps of:
    (a) providing a structure-directing agent,
    (b) by use of the structure-directing agent, generating on a semiconductor substrate a film comprising a zeolite having a framework density below 15 T atoms per 1000 cubic angstroms and containing predominantly silicon and germanium atoms at T positions,
    (c) removing the structure-directing agent from the film,
    (d) optionally modifying the film to reduce its hydrophilicity.

2. The method of claim 1 wherein the zeolite has an LTA structure.

3. The method of claim 1, wherein the zeolite contains predominantly silicon atoms at T positions.

4. The method of claim 1, wherein the structure-directing agent comprises a salt of a polycyclic organic compound.

5. The method of claim 4, wherein the structure-directing agent comprises 4-methyl-2,3,6,7-tetrahydro-1H,5H-pyrido [3.2.1-ij] quinolinium hydroxide.

6. The method of claim 1, wherein step (b) comprises:
    (b1) generating a suspension of crystals of the predominantly silica zeolite,
    (b2) spin-coating the suspension on the semiconductor substrate.

7. The method of claim 6, wherein step (b) further comprises removing solvent from the spin-coated suspension.

8. The method of claim 6, wherein the crystals have an average diameter of less than 0.5 micrometer.

9. The method of claim 1, wherein the step of removing the structure-directing agent from the film is accomplished by calcining.

10. The method of claim 1, wherein the step of removing the structure-directing agent from the film is accomplished chemically.

11. The method of claim 10, wherein the step of removing the structure-directing agent from the film is accomplished by exposing the film to acidic conditions.

12. The method of claim 1, wherein the step of removing the structure-directing agent from the film is accomplished photochemically.

13. A method of manufacturing an integrated circuit, comprising:
    (a) forming electronic devices on a semiconductor substrate,
    (b) forming on the semiconductor substrate dielectric layers, at least one of which comprises a zeolite having a framework density below 15 T atoms per 1000 cubic angstrom,
    (c) depositing interconnect conductors on the substrate, and
    (d) dicing the semiconductor substrate,
    (e) packaging the resulting diced integrated circuits.

14. The method of claim 13 wherein the zeolite has an LTA structure.

15. The method of claim 13, wherein the zeolite contains predominantly silicon and germanium atoms at T positions.

16. The method of claim 15, wherein the zeolite contains predominantly silicon atoms at T positions.

17. The method of claim 13, wherein the zeolite is formed with the use of a structure-directing agent.

18. The method of claim 17, wherein the structure-directing agent comprises a salt of a polycyclic organic compound.

19. The method of claim 17, further comprising the step of removing the structure-directing agent from the zeolite-comprising dielectric.

20. The method of claim 19, wherein the step of removing the structure-directing agent from the zeolite-comprising dielectric is accomplished chemically.

21. The method of claim 20, wherein the step of removing the structure-directing agent from the film is accomplished by exposing the zeolite-comprising dielectric to acidic conditions.

22. The method of claim 19, wherein the step of removing the structure-directing agent from the zeolite-comprising dielectric is accomplished photochemically.

* * * * *